US011093060B2

(12) United States Patent
Yancey et al.

(10) Patent No.: US 11,093,060 B2
(45) Date of Patent: Aug. 17, 2021

(54) INTERFERENCE DETECTION AND MITIGATION IN INDUCTIVE SENSOR APPLICATIONS AND DYNAMIC ADAPTATION BASED ON REAL-TIME NOISE DETECTION

(71) Applicant: Cirrus Logic International Semiconductor Ltd., Edinburgh (GB)

(72) Inventors: Gregory C. Yancey, Austin, TX (US); Michael Kost, Cedar Park, TX (US); Tejasvi Das, Austin, TX (US); Siddharth Maru, Austin, TX (US); Matthew Beardsworth, Austin, TX (US); Vadim Konradi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/679,773

(22) Filed: Nov. 11, 2019

(65) Prior Publication Data
US 2020/0363891 A1 Nov. 19, 2020

Related U.S. Application Data

(60) Provisional application No. 62/852,718, filed on May 24, 2019, provisional application No. 62/848,718, filed on May 16, 2019.

(51) Int. Cl.
*G06F 3/041* (2006.01)
*G06F 1/16* (2006.01)
(Continued)

(52) U.S. Cl.
CPC ......... *G06F 3/0412* (2013.01); *G01R 27/025* (2013.01); *G01R 27/2605* (2013.01); *G06F 1/1613* (2013.01); *G01R 27/2611* (2013.01)

(58) Field of Classification Search
CPC ...... G06F 3/0412; G06F 3/044; G06F 3/0418; G06F 3/046; G06F 3/04184; G06F 3/016;
(Continued)

(56) References Cited

U.S. PATENT DOCUMENTS

2008/0150917 A1* 6/2008 Libbey .................... G06F 3/046
345/179
2012/0105353 A1* 5/2012 Brosnan ................ G06F 3/0443
345/174
(Continued)

FOREIGN PATENT DOCUMENTS

EP 1635465 A1 3/2006
WO 2020084286 A1 4/2020

OTHER PUBLICATIONS

Search Report under Section 17, UKIPO, Application No. GB2005983.8, dated Jul. 8, 2020.

*Primary Examiner* — Ryan A Lubit
(74) *Attorney, Agent, or Firm* — Jackson Walker L.L.P.

(57) ABSTRACT

A system may include a resistive-inductive-capacitive sensor, a driver configured to drive the resistive-inductive-capacitive sensor at a driving frequency, a measurement circuit communicatively coupled to the resistive-inductive-capacitive sensor and configured to measure phase information and amplitude associated with the resistive-inductive-capacitive sensor, and a noise detection circuit communicatively coupled to the measurement circuit and configured to determine a presence of external interference in the system based on at least one of the phase information and the amplitude information.

60 Claims, 6 Drawing Sheets

(51) Int. Cl.
*G01R 27/02* (2006.01)
*G01R 27/26* (2006.01)

(58) Field of Classification Search
CPC . G06F 3/03545; G06F 1/1613; G01R 27/025; G01R 27/2605; G01R 27/2611; G01R 27/28; G01R 31/002; G01R 29/18; G01R 35/005; G01R 33/0041; H03K 17/9537; H03K 17/954; H03K 17/14; G01D 5/20; G01D 5/243; G01D 18/00; G01D 3/036; G01D 5/14
See application file for complete search history.

(56) References Cited

U.S. PATENT DOCUMENTS

| | | | |
|---|---|---|---|
| 2014/0253102 A1* | 9/2014 | Wood | G01R 23/02 324/140 R |
| 2016/0357327 A1* | 12/2016 | Chang | G06F 3/0418 |
| 2017/0285859 A1* | 10/2017 | Shepelev | G06F 3/0446 |
| 2020/0159382 A1* | 5/2020 | Drumm | G06F 3/04162 |
| 2020/0201475 A1* | 6/2020 | Mani | G09G 3/3208 |

* cited by examiner

INTERFERENCE DETECTION AND MITIGATION IN INDUCTIVE SENSOR APPLICATIONS AND DYNAMIC ADAPTATION BASED ON REAL-TIME NOISE DETECTION

RELATED APPLICATION

The present disclosure claims priority to U.S. Provisional Patent Application Ser. No. 62/848,718, filed May 16, 2019, and U.S. Provisional Patent Application Ser. No. 62/852,718, filed May 24, 2019, both of which are incorporated by reference herein in their entireties.

FIELD OF DISCLOSURE

The present disclosure relates in general to electronic devices with user interfaces, (e.g., mobile devices, game controllers, instrument panels for vehicles, machinery, and/or appliances, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices that are waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a resistive-inductive-capacitive sensor, a driver configured to drive the resistive-inductive-capacitive sensor at a driving frequency, a measurement circuit communicatively coupled to the resistive-inductive-capacitive sensor and configured to measure phase information and amplitude associated with the resistive-inductive-capacitive sensor, and a noise detection circuit communicatively coupled to the measurement circuit and configured to determine a presence of external interference in the system based on at least one of the phase information and the amplitude information.

In accordance with these and other embodiments of the present disclosure, a method may include measuring phase information and amplitude information associated with a resistive-inductive-capacitive sensor driven by a driver at a driving frequency and determining a presence of external interference in a system comprising the resistive-inductive-capacitive sensor based on at least one of the phase information and the amplitude information.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Each of FIGS. 5A-5C illustrates a diagram of selected components of an example resonant phase sensing system, in accordance with embodiments of the present disclosure.

DETAILED DESCRIPTION

Figure 1:
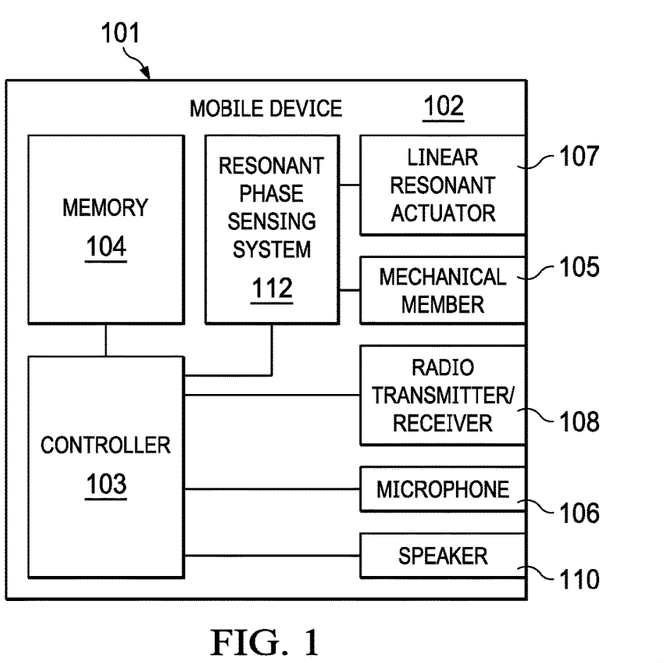
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sensing system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Although the foregoing contemplates a resonant phase sensing system 112 for use in a mobile device 102, the resonant phase sensing system 112 may be used in any other suitable host device. A host device may include without limitation, a portable and/or battery-powered mobile computing device (e.g., a laptop, notebook, or tablet computer), a gaming console, a remote control device, a home automation controller, a domestic appliance (e.g., domestic temperature or lighting control system), a toy, a machine (e.g., a robot), an audio player, a video player, and a mobile telephone (e.g., a smartphone).

Figure 2:
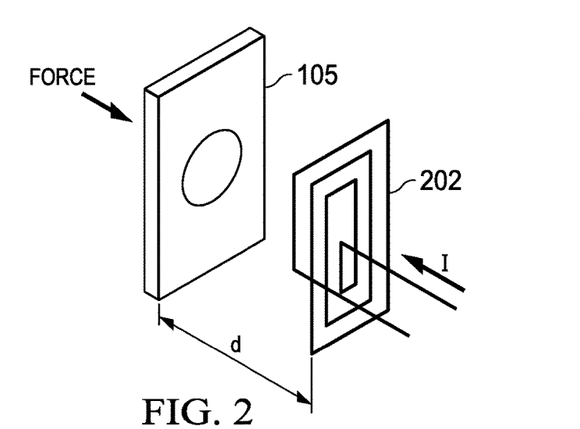
FIG. 2 illustrates a mechanical member separated by a distance from an inductive coil, in accordance with embodiments of the present disclosure.
Figure 3:
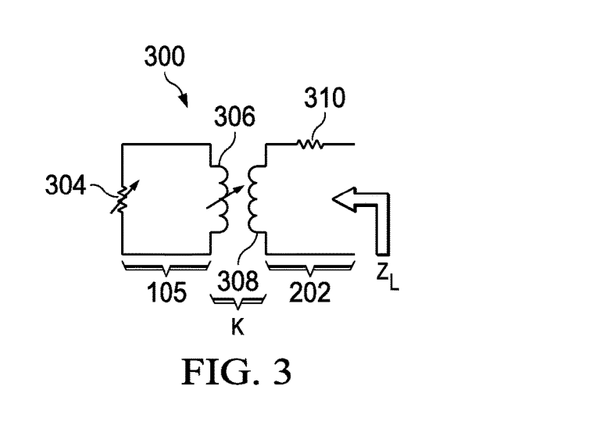
FIG. 3 illustrates selected components of a model for a mechanical member and inductive coil that may be used in an inductive sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of a model for mechanical member 105 and inductive coil 202 that may be used in an inductive sensing system 30, in accordance with embodiments of the present disclosure. As shown in FIG. 3, inductive sensing system 30 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

Figure 4:
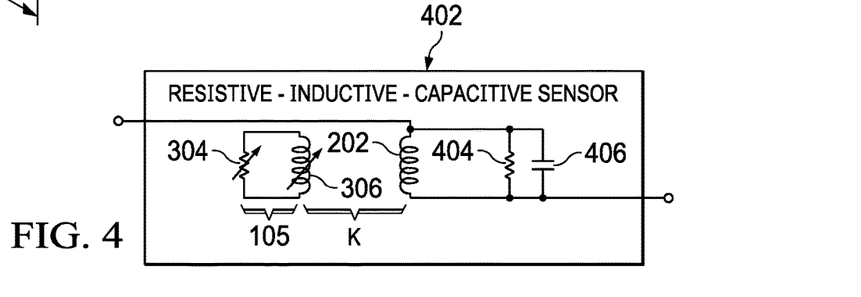
FIG. 4 illustrates selected components of an example resistive-inductive-capacitive sensor, in accordance with embodiments of the present disclosure.

FIG. 4 illustrates selected components of an example resistive-inductive-capacitive sensor 402, in accordance with embodiments of the present disclosure. As shown in FIG. 4, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4 to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Figure 5A:
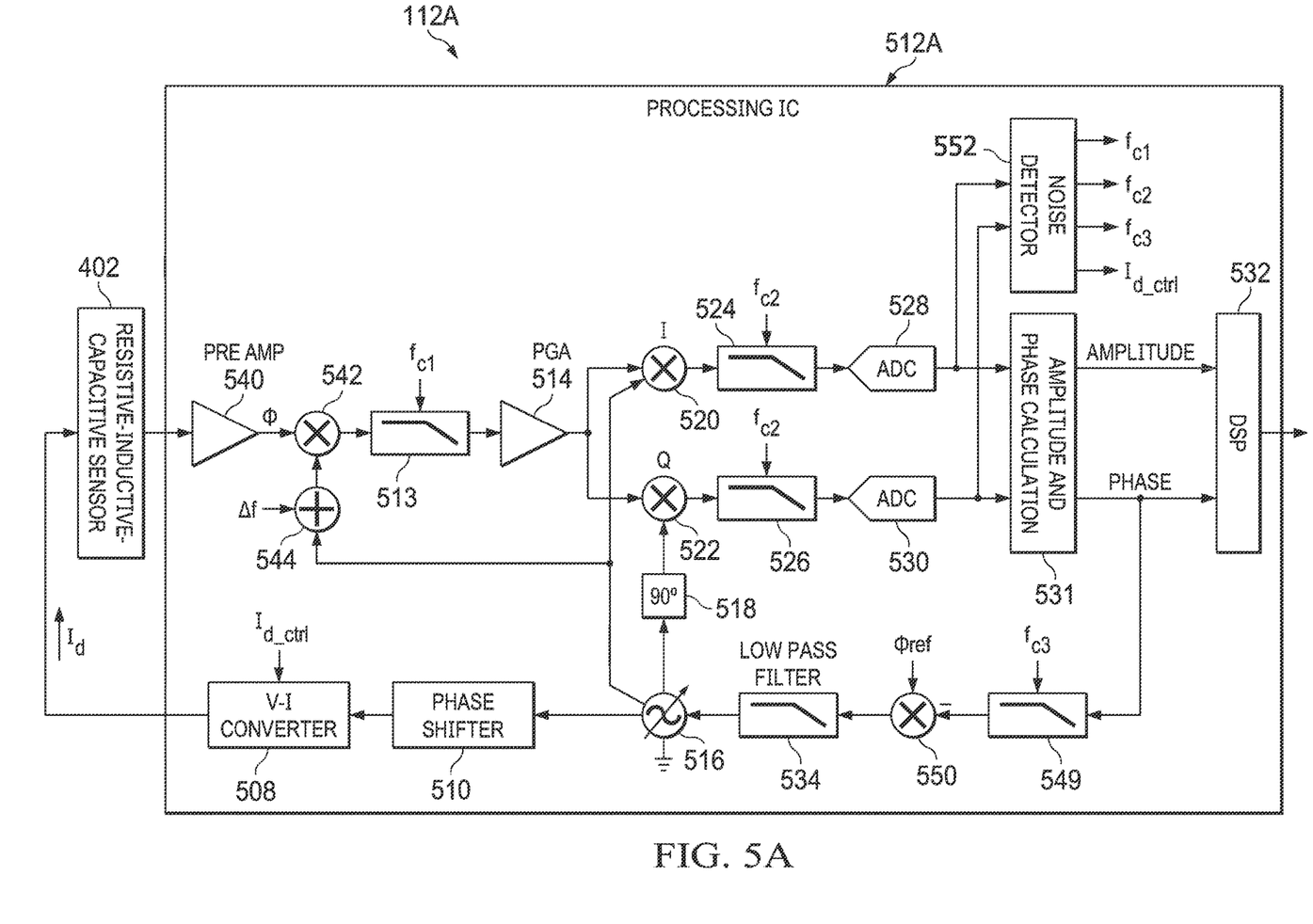

FIG. 5A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown FIG. 5A, resonant phase sensing system 112A may include a resistive-inductive-capacitive sensor 402 and a processing integrated circuit (IC) 512A.

Processing IC 512A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 512A may be configured to determine an occurrence of a physical interaction (e.g., press or release of a virtual button) associated with a human-machine interface associated with mechanical member 105 based on the phase information.

As shown in FIG. 5A, processing IC 512A may include a phase shifter 510, a voltage-to-current (V-I) converter 508, a preamplifier 540, an intermediate frequency mixer 542, a combiner 544, a noise-mitigating filter 513, a programmable gain amplifier (PGA) 514, an oscillator 516, a phase shifter 518, an amplitude and phase calculation block 531, a DSP 532, a low-pass filter 534, a noise-mitigating filter 549, a combiner 550, and a noise detector 552. Processing IC 512A may also include a coherent incident/quadrature detector implemented with an incident channel comprising a mixer 520, a low-pass filter 524, and an analog-to-digital converter (ADC) 528, and a quadrature channel comprising a mixer 522, a low-pass filter 526, and an ADC 530 such that processing IC 512A is configured to measure the phase information using the coherent incident/quadrature detector.

Phase shifter 510 may include any system, device, or apparatus configured to receive an oscillation signal generated by processing IC 512A (as explained in greater detail below) and phase shift such oscillation signal such that at an operating frequency of resonant phase sensing system 112, an incident component of a sensor signal $\phi$ generated by pre-amplifier 540 is approximately equal to a quadrature component of sensor signal $\phi$, so as to provide common mode noise rejection by a phase detector implemented by processing IC 512A, as described in greater detail below.

V-I converter 508 may receive the phase shifted oscillation signal from phase shifter 510, which may be a voltage signal, convert the voltage signal to a corresponding current signal, and drive a current signal $I_d$ on resistive-inductive-capacitive sensor 402 at a driving frequency with the phase-shifted oscillation signal in order to generate sensor signal $\phi$ which may be processed by processing IC 512A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402). In some embodiments, as shown in FIG. 5A, V-I converter 508 may be configured to receive a current control signal $I_{d\_ctrl}$ from noise detector 552 (as described in greater detail below) indicative of a desired magnitude of current signal $I_d$ to be driven to resistive-inductive-capacitive sensor 402, and may drive current signal $I_d$ based on current control signal $I_{d\_ctrl}$.

Preamplifier 540 may receive sensor signal $\phi$ and condition sensor signal $\phi$ for frequency mixing, with mixer 542, to an intermediate frequency $\Delta f$ combined by combiner 544 with an oscillation frequency generated by oscillator 516, as described in greater detail below, wherein intermediate frequency $\Delta f$ is significantly less than the oscillation frequency. In some embodiments, preamplifier 540, mixer 542, and combiner 544 may not be present, in which case PGA 514 may receive sensor signal $\phi$ directly from resistive-inductive-capacitive sensor 402. However, when present, preamplifier 540, mixer 542, and combiner 544 may allow for mixing sensor signal $\phi$ down to a lower intermediate frequency $\Delta f$ which may allow for lower-bandwidth and more efficient ADCs (e.g., ADCs 528 and 530 of FIGS. 5A and 5B and ADC 529 of FIG. 5C, described below) and/or which may allow for minimization of phase and/or gain mismatches in the incident and quadrature paths of the phase detector of processing IC 512A.

In operation, noise-mitigating filter 513 may be configured to, based on a corner frequency control signal $f_{c1}$ received from noise detector 552 and indicative of a desired corner frequency for noise-mitigating filter 513, apply low-pass filtering to sensor signal $\phi$ in order to reduce noise from interference, as is described in greater detail below.

In operation, PGA 514 may further amplify sensor signal $\phi$, as filtered by noise-mitigating filter 513, to condition sensor signal $\phi$ for processing by the coherent incident/quadrature detector. Oscillator 516 may generate an oscillation signal to be used as a basis for the signal driven by V-I converter 508, as well as the oscillation signals used by mixers 520 and 522 to extract incident and quadrature components of amplified sensor signal $\phi$. As shown in FIG. 5A, mixer 520 of the incident channel may use an unshifted version of the oscillation signal generated by oscillator 516, while mixer 522 of the quadrature channel may use a 90-degree shifted version of the oscillation signal phase shifted by phase shifter 518. As mentioned above, the oscillation frequency of the oscillation signal generated by oscillator 516 may be selected based on a resonant frequency of resistive-inductive-capacitive sensor 402 (e.g., may be approximately equal to the resonant frequency of resistive-inductive-capacitive sensor 402). In some embodiments, oscillator 516 may be implemented with a voltage-controlled oscillator (VCO). In other embodiments, oscillator 516 may be implemented with a digitally-controlled oscillator (DCO).

In the incident channel, mixer 520 may extract the incident component of amplified sensor signal $\phi$, low-pass filter 524 may filter out the oscillation signal mixed with the amplified sensor signal $\phi$ to generate a direct current (DC) incident component, and ADC 528 may convert such DC incident component into an equivalent incident component digital signal for processing by amplitude and phase calculation block 531. Similarly, in the quadrature channel, mixer 522 may extract the quadrature component of amplified sensor signal $\phi$, low-pass filter 526 may filter out the phase-shifted oscillation signal mixed with the amplified sensor signal $\phi$ to generate a direct current (DC) quadrature component, and ADC 530 may convert such DC quadrature component into an equivalent quadrature component digital signal for processing by amplitude and phase calculation block 531.

As shown in FIG. 5A, each of filters 524 and 526 may be configured to, based on a corner frequency control signal $f_{c2}$ received from noise detector 552 and indicative of a desired corner frequency for filters 524 and 526, apply low-pass filtering to phase signal PHASE in order to reduce noise from interference, as is described in greater detail below.

Amplitude and phase calculation block 531 may include any system, device, or apparatus configured to receive phase information comprising the incident component digital signal and the quadrature component digital signal and based thereon, extract amplitude and phase information.

DSP 532 may include any system, device, or apparatus configured to interpret and/or execute program instructions and/or process data. In particular, DSP 532 may receive the phase information and the amplitude information generated by amplitude and phase calculation block 531 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 532 may also generate an output signal indicative of the displacement. In some embodiments, such output signal may comprise a control signal for controlling mechanical vibration of linear resonant actuator 107 in response to the displacement.

In operation, noise-mitigating filter 549 may be configured to, based on a corner frequency control signal $f_{c3}$ received from noise detector 552 and indicative of a desired corner frequency for noise-mitigating filter 549, apply low-pass filtering to phase signal PHASE in order to reduce noise from interference, as is described in greater detail below.

Combiner 550 may subtract the phase information generated by amplitude and phase calculation block 531 from a reference phase $\phi_{ref}$ in order to generate an error signal that may be received by low-pass filter 534. Low-pass filter 534 may low-pass filter the error signal, and such filtered error signal may be applied to oscillator 516 to modify the frequency of the oscillation signal generated by oscillator 516, in order to drive sensor signal $\phi$ towards reference phase $\phi_{ref}$. As a result, sensor signal $\phi$ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 534 in connection with oscillator 516 may implement a feedback control loop that may track changes in operating parameters of resonant phase sensing system 112A by modifying the driving frequency of oscillator 516.

Noise detector 552 may comprise any system, device, or apparatus configured to, based on measured phase information (e.g., the outputs of the coherent incident/quadrature detector implemented by processing IC 512A), detect noise within resonant phase sensing system 112A caused by interference external to resonant phase sensing system 112A, and in response to detecting such interference noise, controlling one or more of a corner frequency of noise-mitigating filter 513, a corner frequency of filters 524 and 526, one or more of a corner frequency of noise-mitigating filter 549, and a current signal generated by V-I converter 508 in order to mitigate interference noise, as described in greater detail below. Although FIG. 5A depicts noise detector 552 as receiving the outputs of the coherent incident/quadrature detector implemented by processing IC 512A as inputs, in some embodiments, noise detector 552 may receive the amplitude information and phase information received from amplitude and phase calculation block 531 in addition to or in lieu of the outputs of the coherent incident/quadrature detector implemented by processing IC 512A. In these and other embodiments, noise detector 552 may also receive as inputs any other suitable signal within a signal path of resonant phase sensing system 112.

Figure 5B:
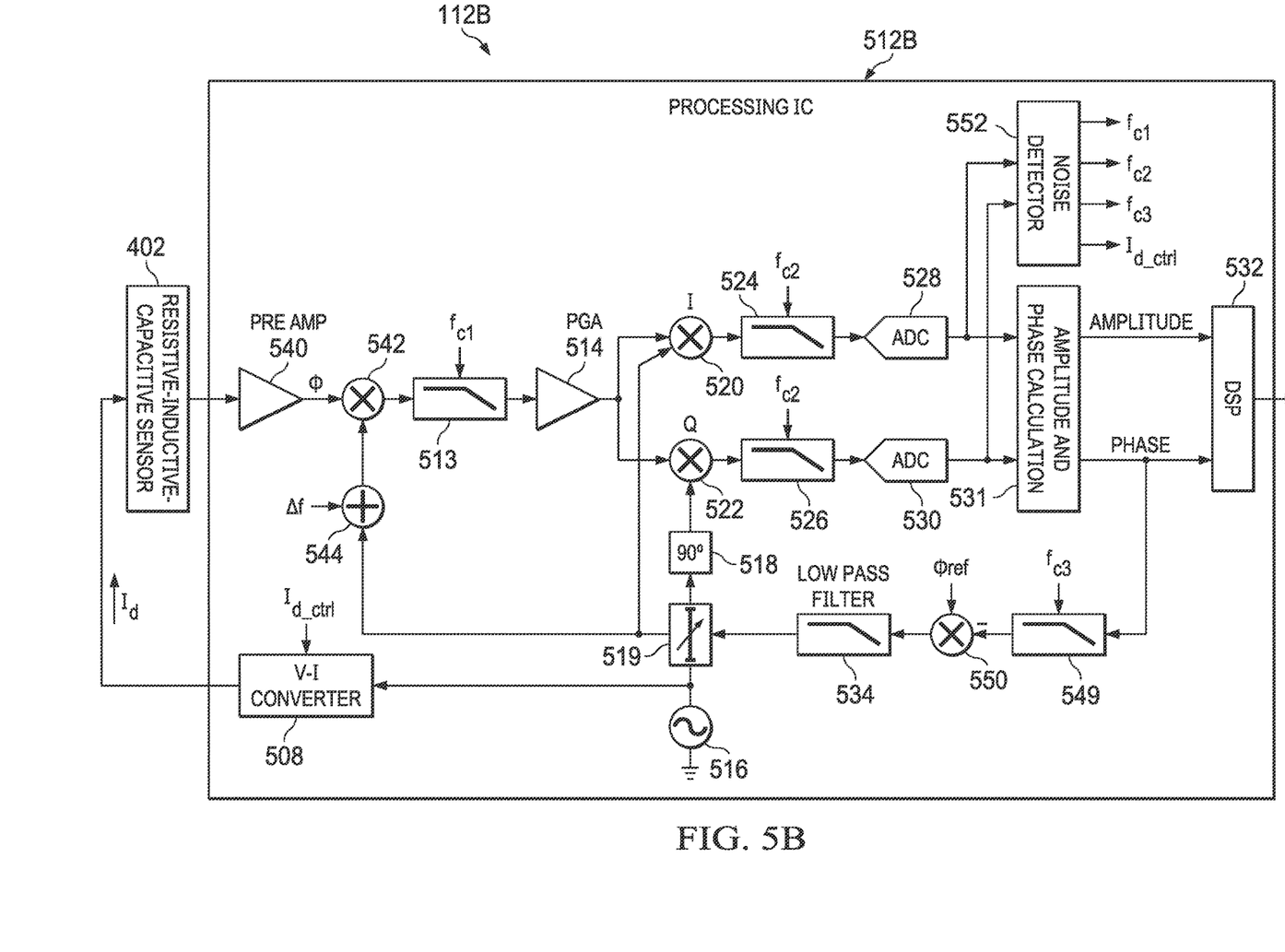

FIG. 5B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 5B may be, in many respects, similar to resonant phase sensing system 112A of FIG. 5A. Accordingly, only those differences between resonant phase sensing system 112B and resonant phase sensing system 112A may be described below. As shown FIG. 5B, resonant phase sensing system 112B may include processing IC 512B in lieu of processing IC 512A. Processing IC 512B of FIG. 5B may be, in many respects, similar to processing IC 512A of FIG. 5A. Accordingly, only those differences between processing IC 512B and processing IC 512A may be described below.

Processing IC 512B may include variable phase shifter 519. Thus, in operation, oscillator 516 may drive a driving signal and oscillation signal which variable phase shifter 519 may phase shift to generate oscillation signals to be mixed by mixers 520 and 522. Similar to that of processing IC 512A, low-pass filter 534 may low-pass filter an error signal based on phase information extracted by amplitude and phase calculation block 531, but instead such filtered error signal may be applied to variable phase shifter 519 to modify the phase offset of the oscillation signal generated by oscillator 516, in order to drive sensor signal $\phi$ towards indicating a phase shift of zero. As a result, sensor signal $\phi$ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 534 in connection with variable phase shifter 519 may implement a feedback control loop that may track changes in operating parameters of resonant phase sensing system 112B by modifying the phase shift applied by variable phase shifter 519.

Figure 5C:
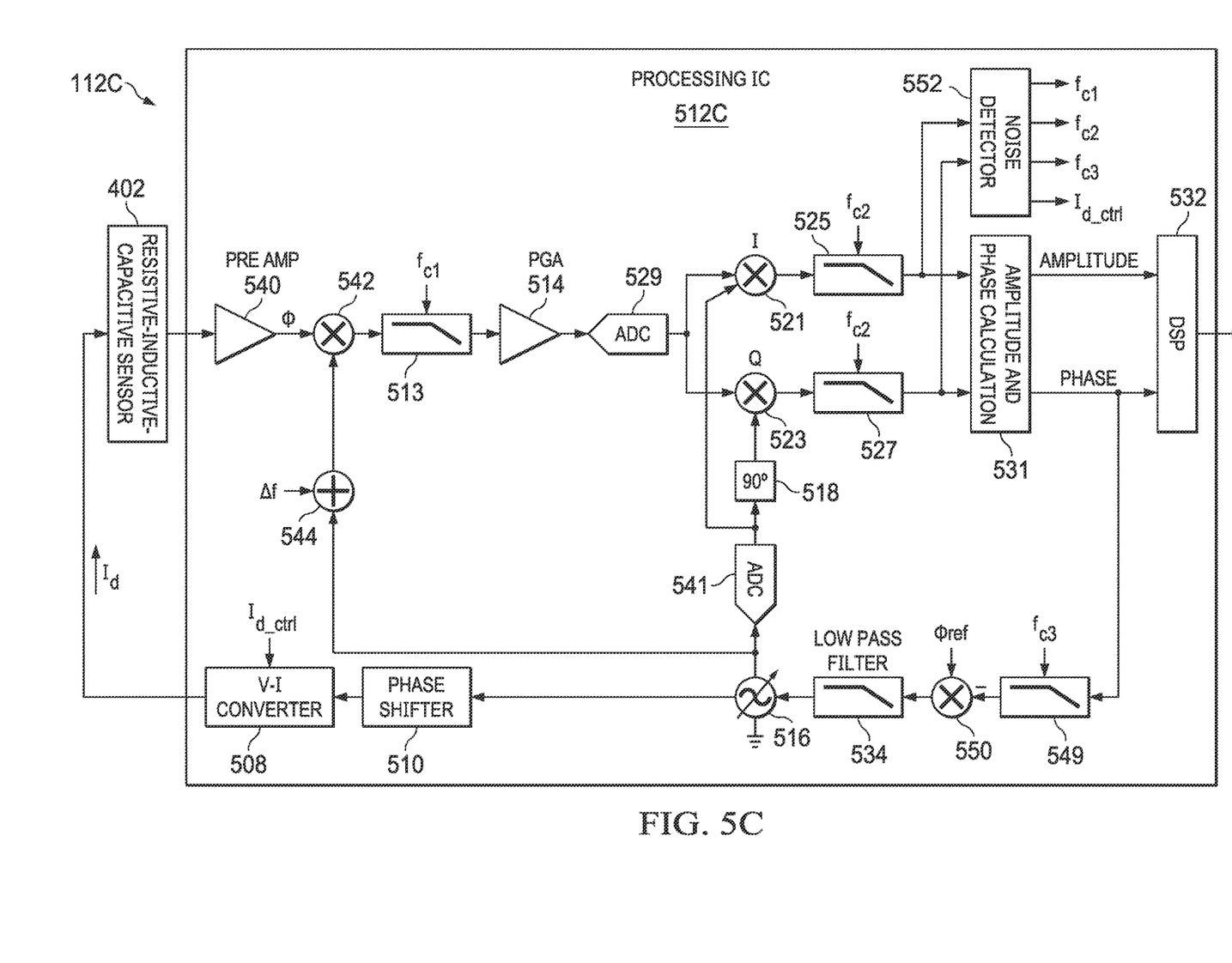

FIG. 5C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 5C may be, in many respects, similar to resonant phase sensing system 112A of FIG. 5A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 529 and ADC 541 in lieu of ADC 528 and ADC 530. Accordingly, a coherent incident/quadrature detector for resonant phase sensing system 112C may be implemented with an incident channel comprising a digital mixer 521 and a digital low-pass filter 525 (in lieu of analog mixer 520 and analog low-pass filter 524) and a quadrature channel comprising a digital mixer 523 and a low-pass filter 527 (in lieu of analog mixer 522 and analog low-pass filter 526) such that processing IC 512C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

As mentioned above, resonant phase sensing system 112 may implement a coherent incident/quadrature detector as a phase detector for determining phase information associated with resistive-inductive-capacitive sensor 402. Notably, coherent incident/quadrature detector is configured to detect phase information at a frequency band of interest, and the coherent incident/quadrature detector, through use of mixers and filters, may be designed to reject signals (and noise) outside of this band. However, external interference lying within the band of interest may degrade the signal-to-noise ratio within resonant phase sensing system 112, thus leading to reduced accuracy. Accordingly, systems and methods are desired to mitigate such interference noise. As mentioned above and described in greater detail below, noise detector 552 may be configured to detect interference noise and generate control signals to mitigate the effects of such detected interference noise.

Figure 6:
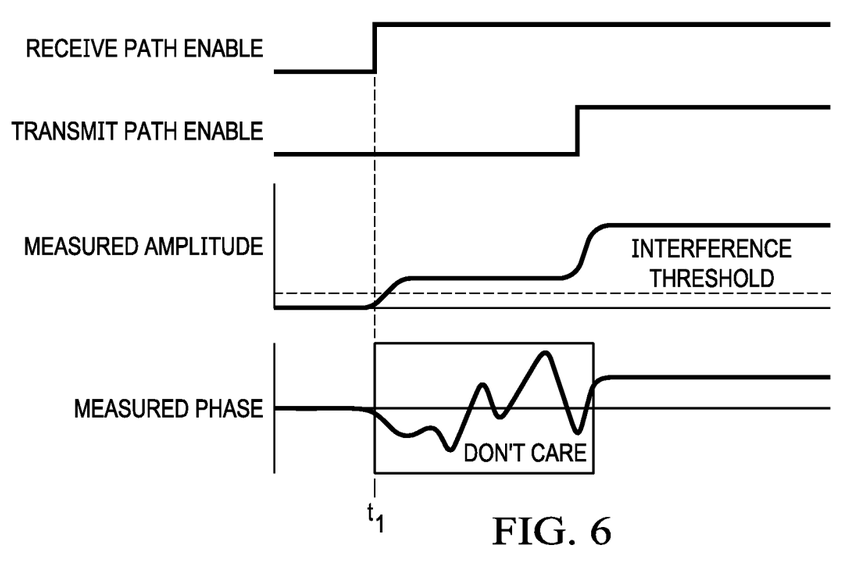
FIG. 6 illustrates graphs of example waveforms that may be present within a resonant phase sensing system in order to detect external interference, in accordance with embodiments of the present disclosure.

FIG. 6 illustrates graphs of example waveforms as a function of time that may be present within resonant phase sensing system 112, including noise detector 552, in order to detect external interference, in accordance with embodiments of the present disclosure. As shown in FIG. 6, resonant phase sensing system 112 may be configured to selectively enable and disable receive path components, selectively enable and disable transmit path components, and measure amplitude and phase information during certain portions of time in which the receive path and the transmit path are selectively enabled and disabled, in order to detect presence of external interference. Referring again briefly to FIG. 5A, transmit path components of resonant phase sensing system 112 may comprise those components which drive resistive-inductive-capacitive sensor 402, including oscillator 516, phase shifter 510, and V-I converter 508. Likewise, receive path components of resonant phase sensing system 112 may comprise those components which receive and process current signal driven by the transmit path, including resistive-inductive-capacitive sensor 402, pre-amplifier 540, PGA 514, the coherent incident/quadrature detector implemented by processing IC 512, amplitude and phase calculation block 531, and DSP 532.

As shown in FIG. 6, resonant phase sensing system 112 may initially disable both of its receive path and transmit path, until a time $t_1$, in which it enables its receive path. Thus, at time $t_1$, the receive path is enabled without an intentional signal being generated by the transmit path. At and after time $t_1$ and while the transmit path remains disabled, resonant phase sensing system 112 may cause an impedance to be coupled to resistive-inductive-capacitive sensor 402 that mimics normal operation of resonant phase sensing system 112, for example by coupling resonant phase sensing system 112 to the disabled V-I converter 508 of the transmit path. Noise detector 552 may compare a signal amplitude detected by the coherent incident/quadrature detector implemented by processing IC 512 against an interference threshold amplitude, and the existence of a detected amplitude in excess of the interference threshold amplitude may indicate the presence of interference noise. During the period in which the transmit path is disabled and the receive path is enabled, the measured phase information of the coherent incident/quadrature detector may be irrelevant, as any interference signal that is received and processed by the coherent incident/quadrature detector may be asynchronous to internal clocks of the coherent incident/quadrature detector.

Figure 7:
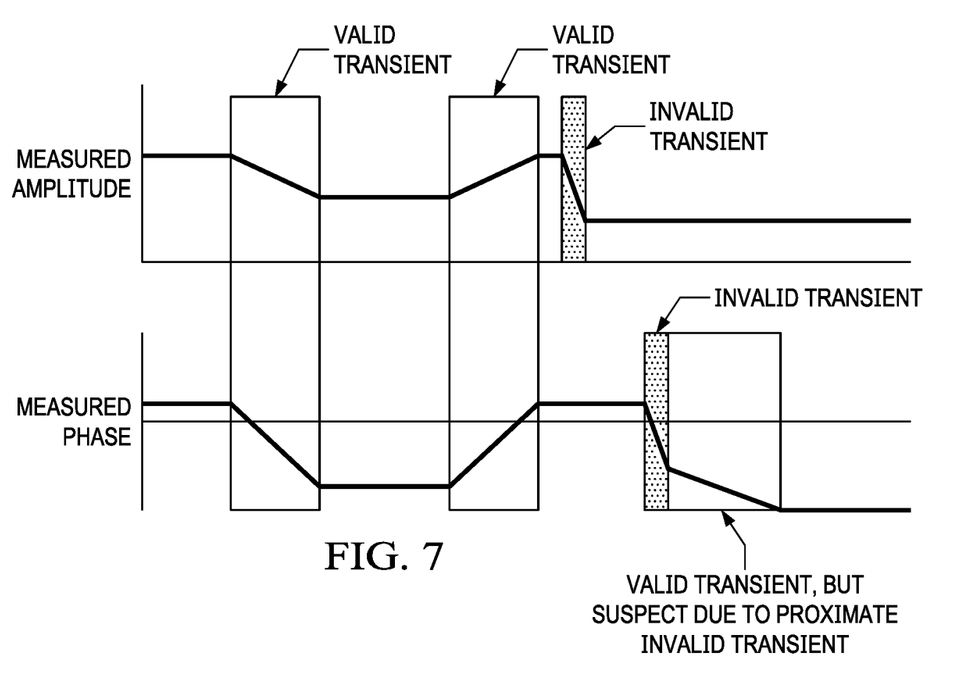
FIG. 7 illustrates graphs of example waveforms that may be measured within a resonant phase sensing system in order to detect external interference, in accordance with embodiments of the present disclosure.

FIG. 7 illustrates graphs of example waveforms that may be measured within resonant phase sensing system 112 in order to detect external interference, in accordance with embodiments of the present disclosure. In particular, FIG. 7 depicts an example measured amplitude waveform versus time and a measured phase waveform versus time of a coherent incident/quadrature detector, and shows characteristics of such waveforms that may indicate presence of interference. As demonstrated by FIG. 7, noise detector 552 may analyze amplitude information and/or phase information during normal operation of resonant phase sensing system 112 to determine if characteristics of interference noise are present.

Implementations of resonant phase sensing system 112 may have signals (including amplitude information and/or phase information) with a known range of transients that are consistent with normal operation and possible changes in process and/or temperature. Noise detector 552, however, may be configured to detect when such transients fall outside of such known range, as such out-of-range transients may be indicative of the presence of interference noise. For example, as illustrated by FIG. 7, the portions of the measured amplitude waveform and the measured phase waveform that are labeled as "valid transient" may comprise transients within known ranges (e.g., changes in amplitude and phase with respect to time are within ranges known to be free of interference). However, the portions of the measured amplitude waveform and the measured phase waveform that are labeled as "invalid transient" may have transients that fall outside of the known ranges (e.g., the rate of change of one or more of such waveforms falls outside a known range), indicating possible presence of interfering noise. In some instances, as shown in FIG. 7, noise detector 552 may also identify transients that are otherwise within known acceptable ranges but occurring proximate in time to an invalid transient as suspect transients which may be discarded as the external interfering signal may be present during subsequent measurement phases.

Figure 8:
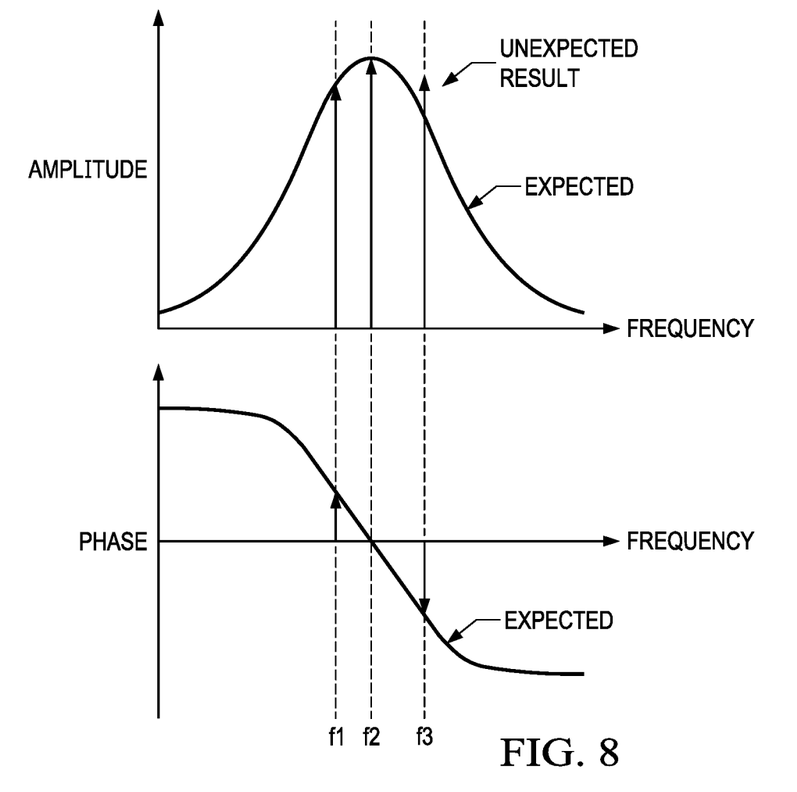
FIG. 8 illustrates graphs of example expected curves for amplitude and phase versus a frequency of a current signal driving a resistive-inductive-capacitive circuit and example measured characteristics of amplitude and phase versus amplitude, in accordance with embodiments of the present disclosure.

FIG. 8 illustrates graphs of example expected curves for amplitude and phase versus frequency current signal $I_d$ driving resistive-inductive-capacitive circuit 402 and example measured characteristics of amplitude and phase versus amplitude, in accordance with embodiments of the present disclosure. As shown by the solid curves in FIG. 8 labeled "EXPECTED," the measured amplitude and measured phase of the coherent incident/quadrature detector as a phase detector implemented by processing IC 512 (e.g., the outputs of phase and amplitude calculation block 531) may have values of amplitude and phase versus driving frequency of resistive-inductive-capacitive circuit 402 in the absence of interference noise. Accordingly, noise detector 552 may take measurements at various frequencies at or near the resonance frequency of resistive-inductive-capacitive circuit 402 to determine if either or both of measured amplitude or measured phase at such frequency is an unexpected value. For instance, in the specific example shown in FIG. 8, noise detector 552 may take amplitude and phase measurements at three different frequencies f1, f2, and f3, and the measured amplitude at frequency f3 may be inconsistent with the known frequency response of resistive-inductive-capacitive circuit 402, thus indicating the presence of interference at frequency f3.

Figure 9:
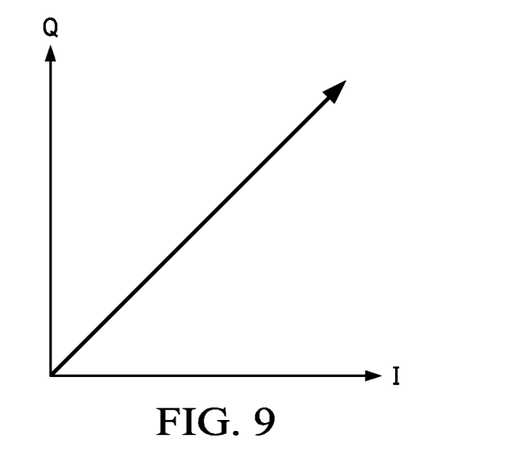
FIG. 9 illustrates a graph of an example relationship between measured quadrature component Q versus a measured incident component I measured by a coherent incident/quadrature detector for a resistive-inductive-capacitive sensor in the absence of interference noise and the absence of interaction with a mechanical member of the resistive-inductive-capacitive sensor, in accordance with embodiments of the present disclosure.

FIG. 9 illustrates a graph of an example relationship between measured quadrature component Q versus a measured incident component I measured by a coherent incident/quadrature detector for resistive-inductive-capacitive sensor 402 in the absence of interference noise and the absence of interaction with mechanical member 105 of resistive-inductive-capacitive sensor 402, in accordance with embodiments of the present disclosure. During normal operation, as described above, phase shifter 510 may modify a phase of current signal $I_d$ driving resistive-inductive-capacitive sensor 402 such that a non-zero signal is present within both the incident and quadrature channels of the coherent incident/quadrature detector implemented by processing IC 512. For example, as shown in FIG. 9, in an ideal case, it may be desirable that the value of the incident component I be equal to the quadrature component Q, in order to maximize measurement sensitivity. However, in a noise measurement phase, resonant phase sensing system 112 may cause phase shifter 510 to modify the phase of current signal $I_d$ such that the output of one of the incident component I or the quadrature component Q is zero, thus increasing sensitivity of such channel in measuring interference noise using one or more of the approaches described above in reference to FIGS. 6-8, and allowing interference noise to be more readily identified.

While the foregoing sets forth systems and methods for detecting the presence of interference noise, noise detector 552 may also be configured to quantify the energy of the noise present. To that end, noise detector 552 or another component of resonant phase sensing system 112 may be configured to obtain a single phase/amplitude measurement by averaging or filtering multiple output samples of the coherent incident/quadrature detector implemented by processing IC 512. The amount of time required to obtain and filter the multiple samples may be referred to as a "conversion time." Thus, the greater number of samples taken to obtain a single measurement, the greater the conversion time.

Various noise sources may introduce error into phase and amplitude measurements, including measurement circuit noise and external interference. Such error may be mitigated by filtering multiple samples of the measured phase and amplitude. For example, filtering more samples may lead to a higher conversion time, but lower error. As another example, heavier filtering (e.g., by use of a lower filter corner frequency) may also lead to lower error. The amount of filtering applied may be determined based on a target measurement accuracy.

Because the magnitude of noise introduced by interference may be unknown, the amount of filtering applied to a measured signal may be determined based on a noise contribution of measurement circuitry and an estimate of noise caused by interference. Thus, once an amount of filtering is determined, if a larger than expected noise is introduced by interference, a target measurement accuracy may not be achieved.

If an amount of external noise due to interference could be predicted or measured, dynamic adjusting of the measurement system may be used to preserve measurement accuracy by additional filtering, and/or power could be conserved to utilize a lower amount of filtering if such lower amount of filtering allows for target measurement accuracy.

Noise detector 552 may be configured to estimate total noise power of resonant phase sensing system 112 by collecting samples for a predetermined conversion time and determining the variance of samples around the mean of such sample. Stated another way:

$$\text{var}_{tot} = \frac{\sum_{i=1}^{n}(\text{sample}_i - \text{sample}_{mean})^2}{n}$$

where n equals the total number of samples taken during the predetermined conversion time, $\text{sample}_i$ is a given sample, and $\text{sample}_{mean}$ is the mean of the samples collected during the predetermined conversion time. Noise power due to measurement circuitry may be known a priori, or may be estimated by measuring the output of the resonant phase sensing system 112 in the absence of an input signal. Stated another way:

$$\text{var}_{measurement} = \frac{\sum_{i=1}^{n}(\text{sample}_i - \text{sample}_{mean})^2}{n}$$

in the absence of an input signal.

Thus, noise detector 552 may estimate the noise introduced by interference as:

$$\text{var}_{interference} = \sqrt{\text{var}_{tot} - \text{var}_{measurement}}$$

Accordingly, noise detector 552 may use the values of $\text{var}_{tot}$, $\text{var}_{measurement}$, and $\text{var}_{intereference}$, to appropriately modify performance of resonant phase sensing system 112, including mitigating the influence of interference noise and/or other noise. Such mitigation may include one or more of:

Informing a downstream process (e.g., a virtual button detection module) of possible corrupted or otherwise misleading phase measurements or invalid transients, such that the downstream process may take such information into account when processing data;

Increasing an amplitude of current signal $I_d$ by communicating a control signal $I_{d\_ctrl}$ to V-I converter 508;

Modifying the driving frequency of the current signal $I_d$ by communicating an appropriate control signal to oscillator 516;

Modifying a resonant frequency of resistive-inductive-capacitive sensor 402 (e.g., by varying a capacitance of resistive-inductive-capacitive sensor 402);

Reporting an alert to a user of the mobile device comprising resonant phase sensing system 112;

Increasing filtering by modifying corner frequencies of one or more filters of resonant phase sensing system 112 (e.g., modifying corner frequency of noise-mitigating filter 513 via control signal $f_{c1}$, modifying corner frequencies of filters 524 and 526 (or 525 and 527) via control signal $f_{c2}$, and/or modifying corner frequency of noise-mitigating filter 549 via control signal $f_{c3}$);

Increasing filtering by increasing a sampling conversion time;

Increasing power consumption within resonant phase sensing system 112 in order to reduce the measurement noise floor; and/or Using additional reference measurements.

In addition, in the presence of low levels of interference noise, one or more of the foregoing parameters may be modified to reduce power consumption in resonant phase sensing system 112. For example, power consumption may be reduced by modifying filter corner frequencies to a higher frequency (e.g., modifying corner frequency of noise-mitigating filter 513 via control signal $f_{c1}$, modifying corner frequencies of filters 524 and 526 (or 525 and 527) via control signal $f_{c2}$, and/or modifying corner frequency of noise-mitigating filter 549 via control signal $f_{c3}$), reducing sample time, or reducing power consumption of the measurement circuitry, which may raise the measurement noise floor.

Although the foregoing contemplates use of closed-loop feedback for sensing of displacement, the various embodiments represented by FIGS. 5A-5C may be modified to implement an open-loop system for sensing of displacement. In such an open-loop system, a processing IC may include no feedback path from amplitude and phase calculation block 531 to oscillator 516 or variable phase shifter 519 and thus may also lack a feedback low-pass filter 534. Thus, a phase measurement may still be made by comparing a change in phase to a reference phase value, but the oscillation frequency driven by oscillator 516 may not be modified or the phase shifted by variable phase shifter 519 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 532 may be capable of processing phase information to make a binary determination of whether physical interaction associated with a human-machine interface associated with mechanical member 105 has occurred and/or ceased to occur, in some embodiments, DSP 532 may quantify a duration of a displacement of mechanical member 105 to more than one detection threshold, for example to detect different types of physical interactions (e.g., a short press of a virtual button versus a long press of the virtual button). In these and other embodiments, DSP 532 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. A system comprising:
a resistive-inductive-capacitive sensor;
a driver configured to drive the resistive-inductive-capacitive sensor at a driving frequency;
a measurement circuit communicatively coupled to the resistive-inductive-capacitive sensor and configured to measure phase information and amplitude associated with the resistive-inductive-capacitive sensor; and
a noise detection circuit communicatively coupled to the measurement circuit and configured to determine a presence of external interference in the system based on a transient response of the at least one of the phase information and the amplitude information.

2. The system of claim 1, wherein the noise detection circuit is configured to determine the presence of external interference in the system based on a profile of the phase information as a function of the driving frequency.

3. The system of claim 1, wherein the noise detection circuit is configured to determine the presence of external interference in the system based on a profile of the amplitude information as a function of the driving frequency.

4. The system of claim 1, wherein the noise detection circuit is configured to determine the presence of external interference in the system based on a rate of change with respect to time of the phase information.

5. The system of claim 4, wherein the noise detection circuit is configured to determine the presence of external interference in the system responsive to the rate of change being outside of an expected range for the rate of change.

6. The system of claim 1, wherein the noise detection circuit is configured to determine the presence of external interference in the system based on a rate of change with respect to time of the amplitude information.

7. The system of claim 6, wherein the noise detection circuit is configured to determine the presence of external interference in the system responsive to the rate of change being outside of an expected range for the rate of change.

8. The system of claim 1, wherein the noise detection circuit is configured to determine the presence of external interference in the system responsive to the transient response being outside of an expected range for the transient response.

9. The system of claim 1, wherein in a noise measurement phase:
the driver is configured to drive a zero signal to the resistive-inductive-capacitive sensor; and
the noise detection circuit is configured to monitor the amplitude information during driving of the zero signal to determine presence of external interference in the system.

10. The system of claim 9, wherein in the noise measurement phase the noise detection is configured to determine the presence of external interference in the system response to the amplitude information during driving of the zero signal exceeding a predetermined threshold amplitude.

11. The system of claim 1, wherein the noise detection circuit is further configured to modify one or more operational parameters of the system in order to mitigate the presence of external interference.

12. The system of claim 11, wherein the one or more operational parameters comprises an amplitude of driving of the resistive-inductive-capacitive sensor by the driver.

13. The system of claim 11, wherein the one or more operational parameters comprises the driving frequency.

14. The system of claim 11, wherein the one or more operational parameters includes a resonant frequency of the resistive-inductive-capacitive sensor.

15. The system of claim 14, wherein the noise detection circuit is configured to modify a capacitance of the resistive-inductive-capacitive sensor in order to modify the resonant frequency.

16. The system of claim 11, wherein the one or more operational parameters includes a filter response of a filter within the system.

17. The system of claim 16, wherein modifying the filter response comprises modifying a corner frequency of the filter.

18. The system of claim 16, wherein modifying the filter response comprises modifying a conversion time of the filter.

19. The system of claim 11, wherein the one or more operational parameters comprises communication of an alert to a processing module downstream of the measurement circuit.

20. The system of claim 11, wherein the one or more operational parameters comprises communication of an alert to a user of a device comprising the system.

21. The system of claim 11, wherein the one or more operational parameters comprises a noise floor of the system.

22. The system of claim 21, wherein the noise floor is modified by modifying power consumption of the system.

23. The system of claim 11, wherein the one or more operational parameters comprises:
an amplitude of driving of the resistive-inductive-capacitive sensor by the driver;
the driving frequency;
a resonant frequency of the resistive-inductive-capacitive sensor;
a filter response of a filter within the system;
communication of an alert to a processing module downstream of a measurement circuit for measuring the amplitude information and the phase information;
communication of an alert to a user of a device comprising the system; and
a noise floor of the system.

24. The system of claim 1, wherein the noise detection circuit is configured to:
perform a plurality of measurements of the phase information, each at a different driving frequency; and
compare the plurality of measurements to an expected phase versus frequency response of the resistive-inductive-capacitive sensor in order to determine the presence of external interference in the system.

25. The system of claim 1, wherein the noise detection circuit is configured to:
perform a plurality of measurements of the amplitude information, each at a different driving frequency; and
compare the plurality of measurements to an expected amplitude versus frequency response of the resistive-inductive-capacitive sensor in order to determine the presence of external interference in the system.

26. The system of claim 1, wherein the noise detection circuitry is further configured to estimate a magnitude of noise induced by the external interference.

27. The system of claim 1, wherein the noise detection circuitry is configured to:
collect a plurality of samples of an output of the measurement circuit;
calculate a total noise power in the system based on the plurality of samples; and
compensate for the noise power due to the resistive-inductive-capacitive sensor and the measurement circuit to estimate the magnitude of the noise.

28. The system of claim 27, wherein the noise detection circuitry is configured to measure the output of the measurement circuit when the driver drives a zero signal to the resistive-inductive-capacitive sensor.

29. A system comprising:
a resistive-inductive-capacitive sensor;
a driver configured to drive the resistive-inductive-capacitive sensor at a driving frequency;
a measurement circuit communicatively coupled to the resistive-inductive-capacitive sensor and configured to measure phase information and amplitude associated with the resistive-inductive-capacitive sensor; and
a noise detection circuit communicatively coupled to the measurement circuit and configured to;
determine a presence of external interference in the system based on at least one of the phase information and the amplitude information; and during a noise measurement mode, increase a sensitivity of the measurement circuit for detecting external interference.

30. The system of claim 29, wherein increasing the sensitivity of the measurement circuit comprises phase shifting a driving signal driven by the driver to maximize sensitivity of one of an incident channel and a quadrature channel of a coherent incident/quadrature detector implemented by the measurement circuit.

31. A method comprising:
measuring phase information and amplitude information associated with a resistive-inductive-capacitive sensor driven by a driver at a driving frequency; and
determining a presence of external interference in system comprising the resistive-inductive-capacitive sensor based on a transient response of at least one of the phase information and the amplitude information.

32. The method of claim 31, further comprising determining the presence of external interference in the system based on a profile of the phase information as a function of the driving frequency.

33. The method of claim 31, further comprising determining the presence of external interference in the system based on a profile of the amplitude information as a function of the driving frequency.

34. The method of claim 31, further comprising determining the presence of external interference in the system based on a rate of change with respect to time of the phase information.

35. The method of claim 34, further comprising determining the presence of external interference in the system responsive to the rate of change being outside of an expected range for the rate of change.

36. The method of claim 31, further comprising determining the presence of external interference in the system based on a rate of change with respect to time of the amplitude information.

37. The method of claim 36, further comprising determining the presence of external interference in the system responsive to the rate of change being outside of an expected range for the rate of change.

38. The method of claim 31, further comprising determining the presence of external interference in the system responsive to the transient response being outside of an expected range for the transient response.

39. The method of claim 31, further comprising, in a noise measurement phase:
driving a zero signal to the resistive-inductive-capacitive sensor; and
monitoring the amplitude information during driving of the zero signal to determine presence of external interference in the system.

40. The method of claim 39, further comprising determining the presence of external interference in the system response to the amplitude information during driving of the zero signal exceeding a predetermined threshold amplitude.

41. The method of claim 31, further comprising modifying one or more operational parameters of the system in order to mitigate the presence of external interference.

42. The method of claim 41, wherein the one or more operational parameters comprises an amplitude of driving of the resistive-inductive-capacitive sensor by the driver.

43. The method of claim 41, wherein the one or more operational parameters comprises the driving frequency.

44. The method of claim 41, wherein the one or more operational parameters includes a resonant frequency of the resistive-inductive-capacitive sensor.

45. The method of claim 44, further comprising modifying a capacitance of the resistive-inductive-capacitive sensor in order to modify the resonant frequency.

46. The method of claim 41, wherein the one or more operational parameters includes a filter response of a filter within the system.

47. The method of claim 46, wherein modifying the filter response comprises modifying a corner frequency of the filter.

48. The method of claim 46, wherein modifying the filter response comprises modifying a conversion time of the filter.

49. The method of claim 41, wherein the one or more operational parameters comprises communication of an alert to a processing module downstream of a measurement circuit for measuring the amplitude information and the phase information.

50. The method of claim 41, wherein the one or more operational parameters comprises communication of an alert to a user of a device comprising the system.

51. The method of claim 41, wherein the one or more operational parameters comprises a noise floor of the system.

52. The method of claim 51, further comprising modifying the noise floor by modifying power consumption of the system.

53. The method of claim 41, wherein the one or more operational parameters comprises:
an amplitude of driving of the resistive-inductive-capacitive sensor by the driver;
the driving frequency;
a resonant frequency of the resistive-inductive-capacitive sensor;
a filter response of a filter within the system;
communication of an alert to a processing module downstream of a measurement circuit for measuring the amplitude information and the phase information;
communication of an alert to a user of a device comprising the system; and
a noise floor of the system.

54. The method of claim 31, further comprising:
performing a plurality of measurements of the phase information, each at a different driving frequency; and
comparing the plurality of measurements to an expected phase versus frequency response of the resistive-inductive-capacitive sensor in order to determine the presence of external interference in the system.

55. The method of claim 31, further comprising:
performing a plurality of measurements of the amplitude information, each at a different driving frequency; and
comparing the plurality of measurements to an expected amplitude versus frequency response of the resistive-inductive-capacitive sensor in order to determine the presence of external interference in the system.

56. The method of claim 31, further comprising estimating a magnitude of noise induced by the external interference.

57. The method of claim 31, further comprising:
collecting a plurality of samples of an output of a measurement circuit for measuring the amplitude information and the phase information;
calculating a total noise power in the system based on the plurality of samples; and
compensating for the noise power due to the resistive-inductive-capacitive sensor and the measurement circuit to estimate the magnitude of the noise.

58. The method of claim 57, further comprising measuring the output of the measurement circuit when the driver drives a zero signal to the resistive-inductive-capacitive sensor.

59. A method comprising:
- measuring phase information and amplitude information associated with a resistive-inductive-capacitive sensor driven by a driver at a driving frequency;
- determining a presence of external interference in a system comprising the resistive-inductive-capacitive sensor based on at least one of the phase information and the amplitude information; and
- during a noise measurement mode, increasing a sensitivity of a measurement circuit for detecting external interference, wherein the measurement circuit measures the amplitude information and the phase information.

60. The method of claim 59, wherein increasing the sensitivity of the measurement circuit comprises phase shifting a driving signal driven by the driver to maximize sensitivity of one of an incident channel and a quadrature channel of a coherent incident/quadrature detector implemented by the measurement circuit.

* * * * *

UNITED STATES PATENT AND TRADEMARK OFFICE
CERTIFICATE OF CORRECTION

PATENT NO. : 11,093,060 B2
APPLICATION NO. : 16/679773
DATED : August 17, 2021
INVENTOR(S) : Yancey et al.

It is certified that error appears in the above-identified patent and that said Letters Patent is hereby corrected as shown below:

In the Claims

In Column 18, Line 64, in Claim 29, delete "to;" and insert -- to: --, therefor.

Signed and Sealed this
Fifteenth Day of August, 2023

Katherine Kelly Vidal
*Director of the United States Patent and Trademark Office*